(12) United States Patent
Okuhata

(10) Patent No.: US 10,581,653 B2
(45) Date of Patent: Mar. 3, 2020

(54) RECEPTION DEVICE, RECEPTION METHOD, RECORDING MEDIUM FOR RECEIVING SIGNALS

(71) Applicant: JVCKENWOOD Corporation, Yokohama-shi, Kanagawa (JP)

(72) Inventor: Yasuhide Okuhata, Yokohama (JP)

(73) Assignee: JVCKENWOOD CORPORATION, Yokohama-shi (JP)

( * ) Notice: Subject to any disclaimer, the term of this patent is extended or adjusted under 35 U.S.C. 154(b) by 0 days.

(21) Appl. No.: 16/529,835

(22) Filed: Aug. 2, 2019

(65) Prior Publication Data

US 2019/0356521 A1 Nov. 21, 2019

Related U.S. Application Data

(63) Continuation of application No. PCT/JP2017/043261, filed on Dec. 1, 2017.

(30) Foreign Application Priority Data

Feb. 3, 2017 (JP) .................................. 2017-018466

(51) Int. Cl.
*H04L 27/00* (2006.01)
*H04L 27/14* (2006.01)
(Continued)

(52) U.S. Cl.
CPC .......... *H04L 27/0014* (2013.01); *H04L 27/14* (2013.01); *H03D 1/2245* (2013.01);
(Continued)

(58) Field of Classification Search
CPC ...... H03D 3/245; H03D 7/163; H03D 1/2245; H04L 27/3863; H04L 2025/03414;
(Continued)

(56) References Cited

U.S. PATENT DOCUMENTS 6,449,471 B1 * 9/2002 Katsura .................. H03D 3/008
329/304
2004/0097212 A1 5/2004 Matsumoto
(Continued)

FOREIGN PATENT DOCUMENTS

EP 0508401 A2 * 10/1992 ......... H04L 27/1525
JP 03-16349 H 1/1991
(Continued)

*Primary Examiner* — Leila Malek
(74) *Attorney, Agent, or Firm* — Brundidge & Stanger, P.C.

(57) ABSTRACT

A local oscillator outputs a local oscillation signal. A orthogonal detector subjects a received signal to orthogonal detection by using the local oscillation signal so as to output an I-phase baseband signal and a Q-phase baseband signal. A first HPF and a second HPF reduce a direct current component of each of the I-phase baseband signal and the Q-phase baseband signal. A demodulator demodulates the I-phase baseband signal and the Q-phase baseband signal output from the first HPF and the second HPF. A distribution detector detects an unevenness in a distribution of the I-phase baseband signal and the Q-phase baseband signal with the reduced direct current component. When the distribution detector detects an unevenness in the distribution, the distribution detector changes a status of the first HPF and the second HPF.

6 Claims, 16 Drawing Sheets

(51) Int. Cl.
*H03D 1/22* (2006.01)
*H03D 3/24* (2006.01)
*H03D 7/16* (2006.01)

(52) U.S. Cl.
CPC ............ *H03D 3/245* (2013.01); *H03D 7/163* (2013.01); *H04L 2027/0024* (2013.01)

(58) Field of Classification Search
CPC ..... H04L 2025/03522; H04L 25/03159; H04L 25/061; H04L 27/148; H04L 27/06; H04L 27/14; H04L 27/1525; H04L 27/22; H04L 27/2601; H04L 5/06; H04B 1/10; H04B 1/30
USPC ........................................................ 375/350
See application file for complete search history.

(56) References Cited

U.S. PATENT DOCUMENTS

| | | | |
|---|---|---|---|
| 2004/0114671 A1* | 6/2004 | Inogai | ..................... H04L 5/026 375/146 |
| 2013/0142293 A1 | 6/2013 | Yoshida | |
| 2014/0105331 A1 | 4/2014 | Ashkenazi | |
| 2017/0302311 A1 | 10/2017 | Okuhata | |
| 2017/0302318 A1 | 10/2017 | Okuhata | |

FOREIGN PATENT DOCUMENTS

| | | |
|---|---|---|
| JP | 2013016878 A | 1/2013 |
| JP | 2013120957 A | 6/2013 |
| WO | 2011055495 A1 | 5/2011 |
| WO | 2016121232 A1 | 8/2016 |
| WO | 2016136039 A1 | 9/2016 |

\* cited by examiner

300

T1

22

T1

22

T1  T2

22

T1  T3

22

T1  T3

22

T1  T2

28

T1'  T2'

62

RECEPTION DEVICE, RECEPTION METHOD, RECORDING MEDIUM FOR RECEIVING SIGNALS

CROSS-REFERENCE TO RELATED APPLICATION

This application is based upon and claims the benefit of priority from the prior Japanese Patent Application No. 2017-018466, filed on Feb. 3, 2017, the entire contents of which is incorporated herein by reference.

BACKGROUND OF THE INVENTION

1. Field

The present invention relates to reception technologies and, more particularly, to reception devices, reception methods, and programs for receiving signals.

2. Description of the Related Art

Direct conversion Frequency Modulation (FM) reception devices change an RF signal into a baseband signal by orthogonal detection and subsequently amplify the baseband signal using an amplifier. Because an unnecessary direct current component is output by the amplifier, the FM reception device reduces the direct current component included in the baseband signal by using a coupling capacitor. Further, the FM reception device subjects the baseband signal in which the direct current component is reduced to FM detection (see, for example, patent document 1).

PATENT LITERATURE

[patent document 1] JP3-16349

In the direct conversion scheme, distortion of an intense disturbing wave creates an unnecessary direct current component in the baseband signal, and the unnecessary direct current component degrades the demodulated signal when superimposed on the baseband signal of the desired wave. In the event that the disturbing wave occurs or when the wave stops being transmitted, the unnecessary direct current component varies abruptly. In the case the direct current (DC) offset is reduced by using a coupling capacitor, an abrupt variation in the unnecessary direct current component is output from the coupling capacitor, which extends a period of time before stabilization.

SUMMARY OF THE INVENTION

A reception device according to an embodiment includes: a local oscillator that outputs a local oscillation signal; an orthogonal detector that subjects a received signal to orthogonal detection by using the local oscillation signal output from the local oscillator so as to output an I-phase baseband signal and a Q-phase baseband signal; a high-pass filter that reduces a direct current component of each of the I-phase baseband signal and the Q-phase baseband signal output from the orthogonal detector; a demodulator that demodulates the I-phase baseband signal and the Q-phase baseband signal output from the high-pass filter; and a distribution detector that detects an unevenness in a distribution of the I-phase baseband signal and the Q-phase baseband signal with the reduced direct current component. When the distribution detector detects an unevenness in the distribution, the distribution detector changes a status of the high-pass filters.

Another embodiment relates to a reception method. The method includes: subjecting a received signal to orthogonal detection by using a local oscillation signal output from a local oscillator so as to output an I-phase baseband signal and a Q-phase baseband signal; reducing a direct current component of each of the I-phase baseband signal and the Q-phase baseband signal by using high-pass filters; demodulating the I-phase baseband signal and the Q-phase baseband signal with the reduced direct current component; detecting an unevenness in the distribution of the I-phase baseband signal and the Q-phase baseband signal with the reduced direct current component; and changing a status of the high-pass filters when an unevenness in the distribution is detected.

Optional combinations of the aforementioned constituting elements, and implementations of the embodiments in the form of methods, apparatuses, systems, recording mediums, and computer programs may also be practiced as additional modes of the embodiments.

According to the embodiments, the time required until the output is stabilized is reduced even when an unnecessary direct current component varies abruptly.

BRIEF DESCRIPTION OF DRAWINGS

Embodiments will now be described, by way of example only, with reference to the accompanying drawings which are meant to be exemplary, not limiting, and wherein like elements are numbered alike in several Figures, in which.

DETAILED DESCRIPTION

The invention will now be described by reference to the preferred embodiments. This does not intend to limit the scope of the present invention, but to exemplify the invention.

Embodiment 1

A summary of the prevent invention will be given before describing the invention in specific detail. Embodiment 1 of the present invention relates to a reception device configured to perform orthogonal detection of direct conversion type. Because an unnecessary direct current component included in a baseband signal subjected to orthogonal detection could degrade the characteristics, the direct current component has been reduced in the related art by using a coupling capacitor, etc. as described above. However, a coupling capacitor cannot track an abrupt variation in the direct current component. In order to reduce degradation of the characteristics caused by an abrupt variation in the direct current component, the reception device according to the embodiment performs the following process.

The reception device uses a high-pass filter to reduce the direct current component included in the I-phase baseband signal and the Q-phase baseband signal subjected to orthogonal detection. Further, the reception device measures distribution of the I-phase baseband signal and the Q-phase baseband signal in a rectangular coordinate system. The reception device detects a variation in the direct current component when an unevenness occurs in the distribution. Upon detecting a variation in the direct current component, the reception device changes the status of the high-pass filter. More specifically, the reception device derives the values of the direct current component in the I-phase baseband signal and the Q-phase baseband signal during a period between the occurrence of the variation in the direct current component and the detection. The reception device rewrites the internal data of the high-pass filter based on the values.

Figure 1:
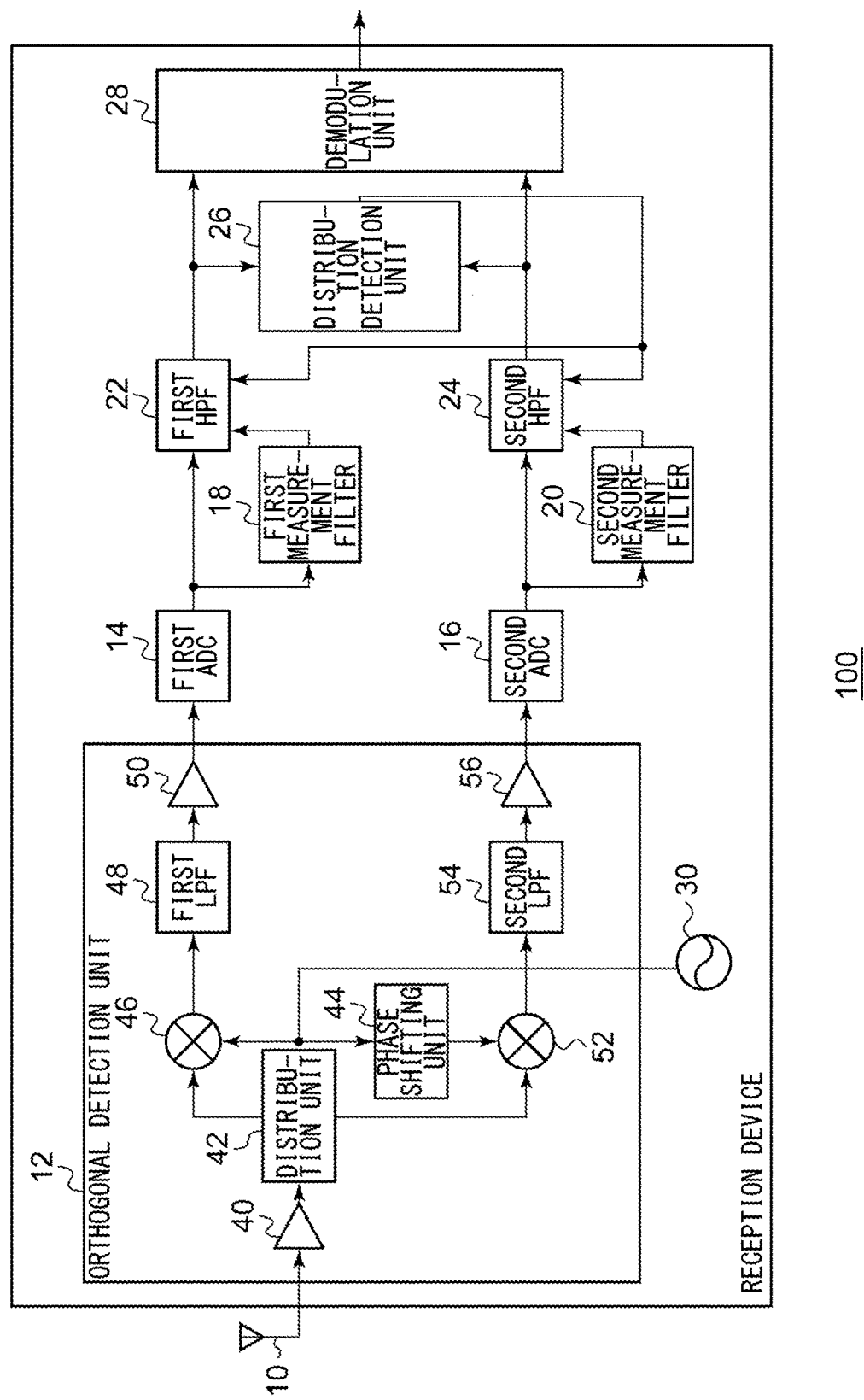
FIG. 1 shows a configuration of a reception device according to Embodiment 1.

FIG. 1 shows a configuration of a reception device 100 according to Embodiment 1. The reception device 100 includes an antenna 10, an orthogonal detection unit 12, a first analog to digital converter (ADC) 14, a second ADC 16, a first measurement filter 18, a second measurement filter 20, a first high-pass filter (HPF) 22, a second HPF 24, a distribution detection unit (distribution detector) 26, a demodulation unit (demodulator) 28, and a local oscillator 30. The orthogonal detection unit 12 includes a first amplifier unit 40, a distribution unit 42, a phase shifting unit 44, a first mixer 46, a first low-pass filter (LPF) 48, a second amplifier unit 50, a second mixer 52, a second LPF 54, and a third amplifier unit 56.

The antenna 10 receives a Radio Frequency (RF) signal from a transmission device (not shown). The RF signal is subjected to FM modulation but may be modulated otherwise. The antenna 10 outputs the received RF signal (hereinafter, also referred to as "received signal") to the first amplifier unit 40. The first amplifier unit 40 is a Low Noise Amplifier (LNA) and amplifiers the RF signal from the antenna 10. The first amplifier unit 40 outputs the amplified RF signal to the distribution unit 42. The distribution unit 42 splits the RF signal from the first amplifier unit 40 into signals of two systems. The distribution unit 42 outputs the split RF signals to the first mixer 46 and the second mixer 52.

The local oscillator 30 outputs a local oscillation signal to the phase shifting unit 44 and the first mixer 46. The phase shifting unit 44 shifts the phase of the local oscillation signal from the local oscillator 30 by 90 degrees. The phase shifting unit 44 outputs the local oscillation signal with the shifted phase to the second mixer 52. The first mixer 46 generates the I-phase baseband signal (hereinafter, "I signal") by multiplying the RF signal from the distribution unit 42 by the local oscillation signal from the local oscillator 30. The first mixer 46 outputs the I signal to the first LPF 48. The second mixer 52 generates the Q-phase baseband signal (hereinafter, "Q signal") by multiplying the RF signal from the distribution unit 42 by the local oscillation signal from the phase shifting unit 44. The second mixer 52 outputs the Q signal to the second LPF 54.

Of the I signals from the first mixer 46, the first LPF 48 eliminates signals of a frequency equal to or higher than a cut-off frequency, thereby limiting the band. The first LPF 48 outputs the I signal comprised of low-frequency components (hereinafter, also referred to as "I signal") to the second amplifier unit 50. Of the Q signals from the second mixer 52, the second LPF 54 eliminates signals of a frequency equal to or higher than a cut-off frequency, thereby limiting the band. The second LPF 54 outputs the Q signal comprised of low-frequency components (hereinafter, also referred to as "Q signal") to the third amplifier unit 56.

The second amplifier unit 50 amplifiers the I signal from the first LPF 48, and the third amplifier unit 56 amplifiers the Q signal from the second LPF 54. The I signal output from the second amplifier unit 50 contains unnecessary direct current components and the Q signal output from the third amplifier unit 56 also contains unnecessary direct current components. As described above, the orthogonal detection unit 12 subjects the RF signal to orthogonal detection. The orthogonal detection unit 12 is comprised of an analog device. For example, the orthogonal detection unit 12 is comprised of one chip.

The first ADC 14 subjects the I signal from the second amplifier unit 50 to analog-to-digital conversion. The first ADC 14 outputs the digitized I signal (hereinafter, also referred to as "I signal") to the first measurement filter 18 and the first HPF 22. The second ADC 16 subjects the Q signal from the third amplifier unit 56 to analog-to-digital conversion. The second ADC 16 outputs the digitized Q signal (hereinafter, also referred to as "Q signal") to the second measurement filter 20 and the second HPF 24.

The first measurement filter 18 calculates a moving average of the I signal from the first ADC 14. The first measurement filter 18 outputs the moving average value of the I signal to the first HPF 22. Calculation of a moving average is equivalent to measuring the direct current component. The second measurement filter 20 calculates a moving average of the Q signal from the second ADC 16. The second measurement filter 20 outputs the moving average value of the Q signal to the second HPF 24.

The first HPF 22 reduces the direct current component of the I signal from the first ADC 14 and outputs the I signal with the reduced direct current component (hereinafter, also referred to as "I signal") to the demodulation unit 28. The second HPF 24 reduces the direct current component of the Q signal from the second ADC 16 and outputs the Q signal with the reduced direct current component (hereinafter, also referred to as "Q signal") to the demodulation unit 28. The moving average value from the first measurement filter 18 is input to the first HPF 22, and the moving average value from the second measurement filter 20 is input to the second HPF 24, but these moving average values are not used in a normal status. The case where the moving average values are used will be described later.

The demodulation unit 28 demodulates the I signal from the first HPF 22 and the Q signal from the second HPF 24. The demodulation unit 28 outputs a demodulated signal that is a demodulation result. The demodulation result of the demodulation unit 28 is equivalent to an audio signal.

The distribution detection unit 26 receives the I signal from the first HPF 22 and the Q signal from the second HPF 24. The distribution detection unit 26 inspects the distribution of the I signal and the Q signal on the IQ plane. When the distribution detection unit 26 detects an unevenness in the distribution, the distribution detection unit 26 outputs a detection signal to the first HPF 22 and the second HPF 24. The detection signal is a signal to change the status of the first HPF 22 and the second HPF 24. Two specific examples of the configuration of the distribution detection unit 26 will be described below before describing a specific example of the configuration of the first HPF 22. The change in the status of the first HPF 22 and the second HPF 24 will then be discussed.

Figure 2:
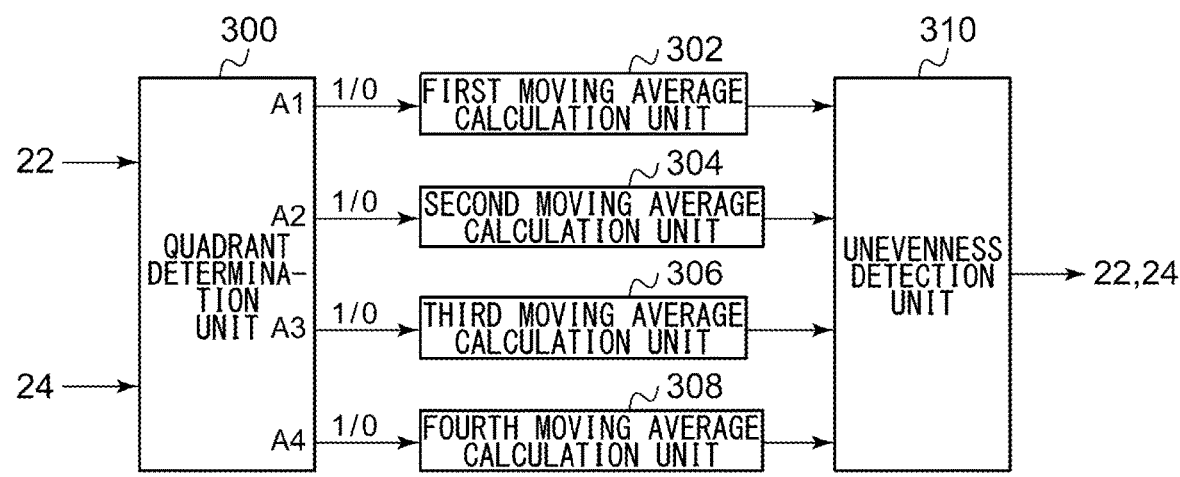
FIG. 2 shows a configuration of the distribution detection unit of FIG. 1.

FIG. 2 shows a configuration of the distribution detection unit 26. The distribution detection unit 26 includes a quadrant determination unit 300, a first moving average calculation unit 302, a second moving average calculation unit 304, a third moving average calculation unit 306, a fourth moving average calculation unit 308, and an unevenness detection unit 310.

Figure 3:
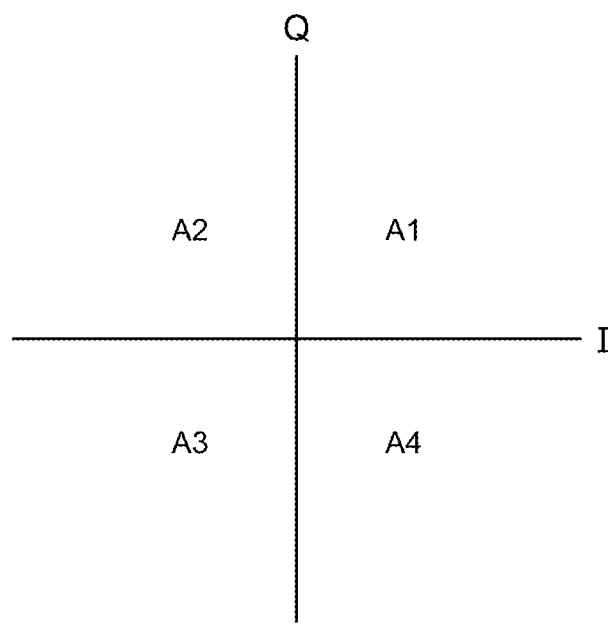
FIG. 3 shows a plurality of quadrants defined by the quadrant determination unit of FIG. 2.

The quadrant determination unit 300 defines a plurality of quadrants as shown in FIG. 3 to determine the quadrant of the I signal from the first HPF 22 and the Q signal from the second HPF 24. FIG. 3 shows a plurality of quadrants defined by the quadrant determination unit 300. As illustrated, four quadrants A1, A2, A3, and A4 are defined. Denoting the value of the input I signal by "I" and denoting the value of input Q signal by "Q", the quadrant determination unit 300 groups the values in one of the quadrants A1, A2, A3, and A4 in accordance with the following conditions for determination.

A1: $I \leq 0$, $Q \geq 0$
A2: $I < 0$, $Q \leq 0$
A3: $I < 0$, $Q < 0$
A4: $I \geq 0$, $Q < 0$ The quadrant determination unit 300 has output terminals corresponding to the four quadrants, respectively. The quadrant determination unit 300 outputs "1" from the output terminal corresponding to the quadrant in which the combination of the I signal and the Q signal is included and outputs "0" from the other output terminals.

The first moving average calculation unit 302 is connected to the output terminal of the quadrant determination unit 300 corresponding to the quadrant "A1", and the second moving average calculation unit 304 is connected to the output terminal of the quadrant determination unit 300 corresponding to the quadrant "A2". Further, the third moving average calculation unit 306 is connected to the output terminal of the quadrant determination unit 300 corresponding to the quadrant "A3", and the fourth moving average calculation unit 308 is connected to the output terminal of the quadrant determination unit 300 corresponding to the quadrant "A4". Each of the first moving average calculation unit 302 through the fourth moving average calculation unit 308 calculates a moving average of a predetermined number of samples of the values input from the quadrant determination unit 300. Each of the first moving average calculation unit 302 through the fourth moving average calculation unit 308 outputs the moving average value to the unevenness detection unit 310.

The unevenness detection unit 310 receives the moving average value from each of the first moving average calculation unit 302 through the fourth moving average calculation unit 308. When the I signal and the Q signal occur in all quadrants in the predetermined number of samples, all moving average values will be other than "0". When the I signal and the Q signal do not occur in one of the quadrants, the moving average value corresponding to that quadrant will be "0". When any of the four moving average values becomes "0", the unevenness detection unit 310 outputs a detection signal, which indicates detection of an unevenness in the distribution, to the first HPF 22 and the second HPF 24.

Figure 4:
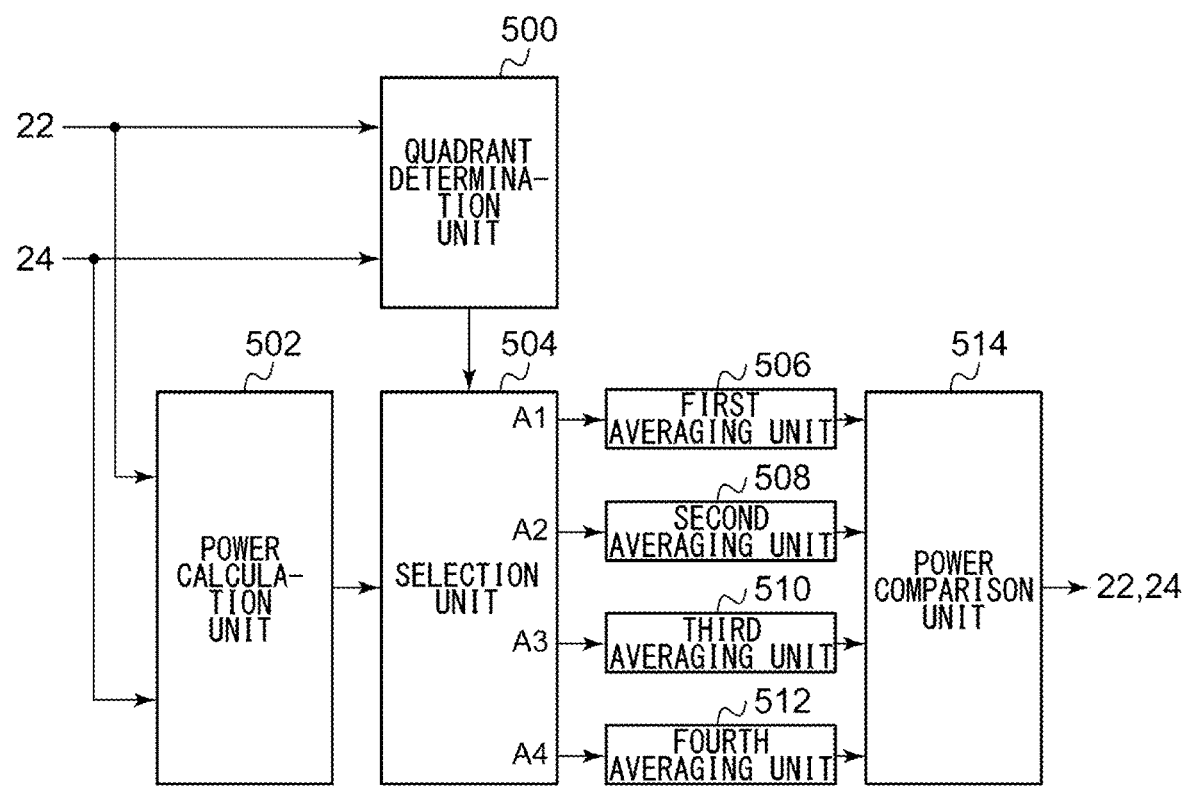
FIG. 4 shows another configuration of the distribution detection unit of FIG. 1.

FIG. 4 shows another configuration of the distribution detection unit 26. The distribution detection unit 26 includes a quadrant determination unit 500, a power calculation unit 502, a selection unit 504, a first averaging unit 506, a second averaging unit 508, a third averaging unit 510, a fourth averaging unit 512, and a power comparison unit 514. The quadrant determination unit 500 performs a process similar to that of the quadrant determination unit 300. The quadrant determination unit 500 outputs the determined quadrant to the selection unit 504.

The power calculation unit 502 receives the I signal from the first HPF 22 and the Q signal from the second HPF 24. The power calculation unit 502 calculates a square value of the I signal, calculates a square value of the Q signal, and calculates a power value by adding the square values. The power calculation unit 502 outputs the power value to the selection unit 504. The selection unit 504 receives the power value from the power calculation unit 502 and receives the result of quadrant determination from the quadrant determination unit 500. The selection unit 504 has output terminals corresponding to the four quadrants, respectively, and outputs the power value from the output terminal corresponding to the result of quadrant determination. The power value is not output from the other output terminals.

The first averaging unit 506, the second averaging unit 508, the third averaging unit 510, and the fourth averaging unit 512 calculate an average of the input power value (hereinafter, "average power value"). In other words, the average power value for each quadrant is derived. The power comparison unit 514 receives the average of the power value from each of the first averaging unit 506 through the fourth averaging unit 512. The power comparison unit 514 detects an unevenness in the distribution by comparing the average power values of the respective quadrants. When the ratio between the maximum value and the minimum value of the average power values is 10 or greater, for example, the power comparison unit 514 outputs a detection signal indicating detection of an unevenness in the distribution to the first HPF 22 and the second HPF 24. The ratio is not limited to "10".

Figure 5:
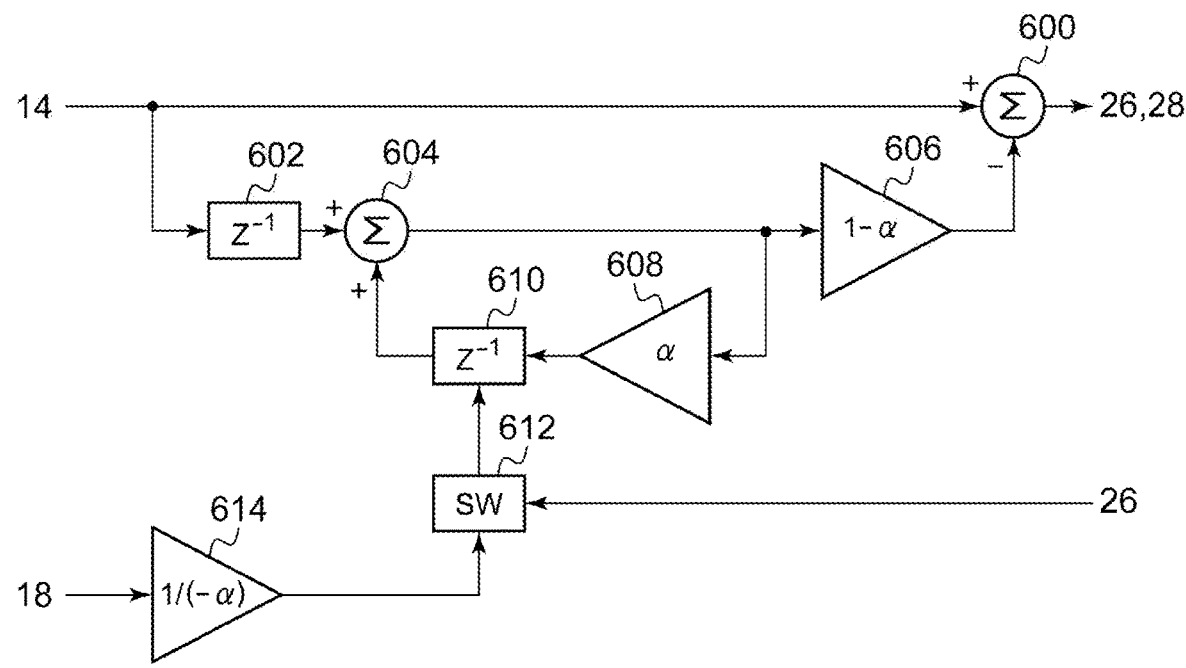
FIG. 5 shows a configuration of the first HPF of FIG. 1.

FIG. 5 shows a configuration of the first HPF 22. The first HPF 22 includes an adder unit 600, a delay unit 602, an adder unit 604, an amplifier unit 606, an amplifier unit 608, a delay unit 610, a selection unit 612, and an amplifier unit 614.

The delay unit 602 delays the I signal from the first ADC 14 by one sample. The I signal delayed by one sample is input to the primary LPF formed by the adder unit 604, the amplifier unit 608, and the delay unit 610, and the primary LPF outputs the averaged I signal. Given that the coefficient of the amplifier unit 608 is a, the gain of the primary LPF formed by the adder unit 604, the amplifier unit 608, and the delay unit 610 will be $1/(1-a)$ so that the amplifier unit 606 applies $(1-a)$ gain correction on the averaged I signal. The adder unit 600 subtracts the I signal with the corrected gain from the I signal from the first ADC 14. The adder unit 600 outputs an addition result as the I signal with the reduced direct current component. α is a value equal to or smaller than 1, and the closer α to 1, the steeper the characteristics of the HPF.

In such a configuration, the amplifier unit 614 corrects the gain of the moving average value. When the detection signal from the distribution detection unit 26 is received, the selection unit 612 rewrites the value in the delay unit 610 by the moving average value with the corrected gain. As described above, the gain of the primary LPF formed by the adder unit 604, the amplifier unit 608, and the delay unit 610 is 1/(1−a), and the value in the delay unit 610 will also be 1/(1−a) times the average value. Therefore, when the gain of the input moving average value is 1, the amplifier unit 614 performs multiplication by 1/(1−a) so that the gain will be the same as the gain of the value in the delay unit 610. The second HPF 24 is also configured as shown in FIG. 5 and processes the Q signal instead of the I signal.

Thus, when the distribution detection unit 26 detects an unevenness in the distribution, the values in the first HPF 22 and the second HPF 24 are rewritten by the values of the direct current components measured in the first measurement filter 18 and the second measurement filter 20, respectively. As a result, the unevenness in the distribution of the I signal and the Q signal output from the first HPF 22 and the second HPF 24 is reduced so that the distortion of the signal demodulated by the demodulation unit 28 is also reduced.

Figure 6:
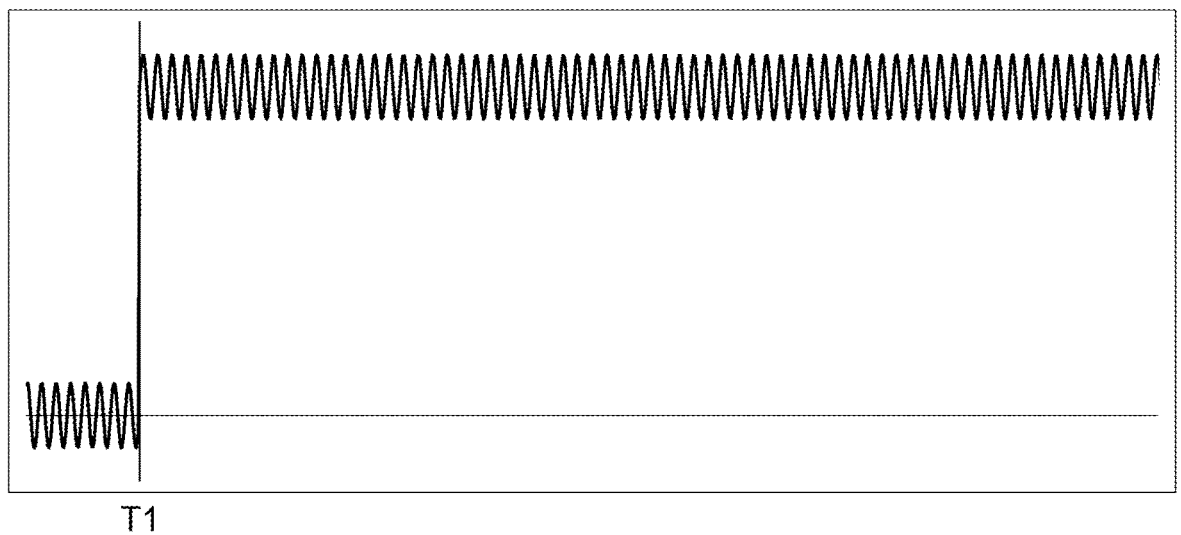
FIG. 6 shows a waveform of a signal input to the first HPF of FIG. 1.

FIG. 6 shows a waveform of a signal input to the first HPF 22. By way of example, the level of the I signal increases at "T1" due to a variation in the direct current component. The level of the I signal remains constant until "T1", and the level of the I signal from "T1" also remains constant.

Figure 7:
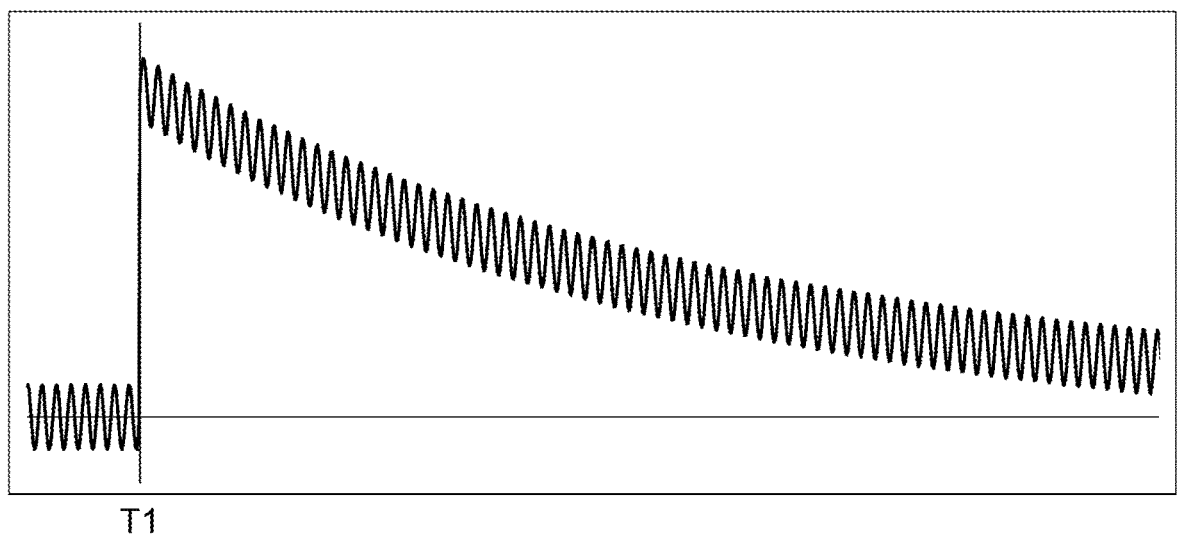
FIG. 7 shows a waveform of a signal output from the first HPF in the absence of determination in the distribution detection unit of FIG. 1.

FIG. 7 shows a waveform of a signal output from the first HPF 22 in the absence of determination in the distribution detection unit 26. When the first HPF 22 operates simply as an HPF, the variation in the direct current component from "T1" is directly output, and the direct current component converges to "0" in accordance with the time constant of the first HPF 22. To simplify the description, the processing delay in the first HPF 22 is assumed to be "0".

Figure 8:
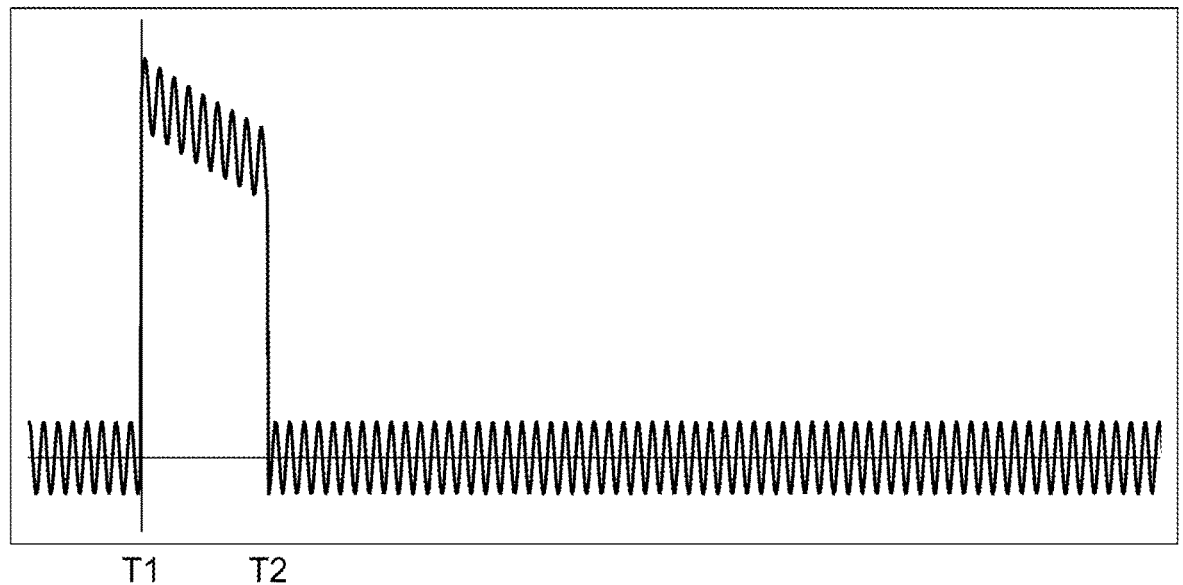
FIG. 8 shows a waveform of a signal output from the first HPF of FIG. 1.

FIG. 8 shows a waveform of a signal output from the first HPF 22. When the I signal exhibits a positive-only distribution as shown in FIG. 7, the distribution detection unit 26 determines that there is an unevenness in the signal after a predetermined period of time. After the determination, the internal data in the first HPF 22 is replaced by the value of the I signal averaged by the first measurement filter 18 so that the signal as shown in FIG. 8 is output. The processing delay elapsed until the determination by the distribution detection unit 26 is denoted by "T2-T1" so that the level of the I signal from "T2" will be equal to the level of the I signal until "T1". The waveform of the signal in the second HPF 24 is also as shown in FIG. 6 through FIG. 8.

The features are implemented in hardware such as a CPU, a memory, or other LSI's, of any computer and in software such as a program loaded into a memory. The figure depicts functional blocks implemented by the cooperation of these elements. Therefore, it will be understood by those skilled in the art that the functional blocks may be implemented in a variety of manners by hardware only, software only, or by a combination of hardware and software.

According to the embodiment, the status of the high-pass filter is changed when an unevenness in the distribution of the baseband signal is detected. Therefore, the impact of variation in the direct current component is reduced. Since the impact of variation in the direct current component is reduced, the time elapsed until the output is stabilized is reduced even in the presence of an abrupt variation in an unnecessary direct current component. Further, since the value of the signal in the high-pass filter is rewritten by the value of the direct current component when an unevenness in the distribution of the baseband signal is detected, the value is changed in such a manner the post-variation direct current component is cut. Since the value of the signal in the high-pass filter is changed to cut the post-variation direct current component, the variation in the output waveform of the high-pass filter caused by the variation in the direct current component is reduced. Since the variation in the output waveform of the high-pass filter caused by the variation in the direct current is reduced, the distortion in the waveform of the demodulated signal is reduced.

Embodiment 2

A description will now be given of Embodiment 2. Like Embodiment 1, Embodiment 2 of the present invention relates to direct conversion reception devices. Embodiment 2 is directed to the purpose of further reducing the period of time during which the signal output from the first HPF and the second HPF is subject to the impact of variation in the direct current component. The following description concerns a difference from the foregoing embodiment.

Figure 9:
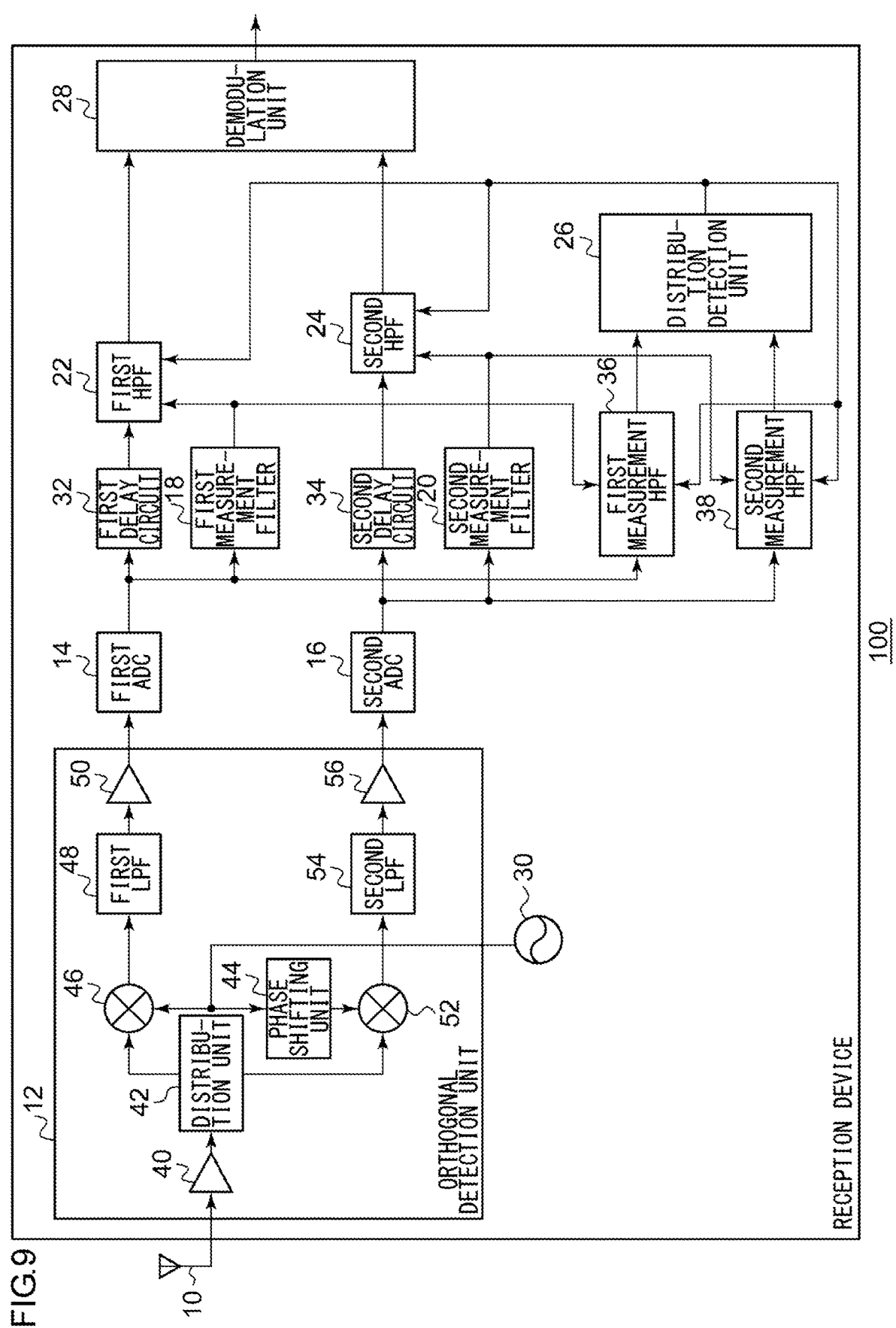
FIG. 9 shows a configuration of a reception device according to Embodiment 2.

FIG. 9 shows a configuration of a reception device 100 according to Embodiment 2. In addition to the features of FIG. 1, the reception device 100 includes a first delay circuit 32, a second delay circuit 34, a first detection HPF 36, and a second detection HPF 38. The first delay circuit 32 is provided between the first ADC 14 and the first HPF 22, and the second delay circuit 34 is provided between the second ADC 16 and the second HPF 24. Further, the first HPF 22 is not connected to the distribution detection unit 26, but the first detection HPF 36 is connected to the first HPF 22. The second HPF 24 is not connected to the distribution detection unit 26, but the second detection HPF 38 is connected to the distribution detection unit 26. The first detection HPF 36 and the second detection HPF 38 have the same configuration as the first HPF 22 and the second HPF 24, respectively.

The first delay circuit 32 delays the I signal output from the first ADC 14 over a period of time commensurate with the processing delay in the first measurement filter 18 and outputs the delayed I signal (hereinafter, also referred to as "I signal") to the first HPF 22. The second delay circuit 34 delays the Q signal output from the second ADC 16 over a period of time commensurate with the processing delay in the second measurement filter 20 and outputs the delayed Q signal (hereinafter, also referred to as "Q signal") to the second HPF 24. The first HPF 22 processes the I signal from the first delay circuit 32 as already described above, and the second HPF 24 processes the Q signal from the second delay circuit 34 as already described above.

The first detection HPF 36 reduces the direct current component of the I signal from the first ADC 14 and outputs the I signal with the reduced direct current component (also referred to as "I signal") to the distribution detection unit 26. The I signal from the first ADC 14 can be said to be the I signal in which the delay induced by the first delay circuit 32 is avoided. The second detection HPF 38 reduces the direct current component of the Q signal from the second ADC 16 and outputs the Q signal with the reduced direct current component (also referred to as "Q signal") to the distribution detection unit 26. The Q signal from the second ADC 16 can be said to be the Q signal in which the delay induced by the second delay circuit 34 is avoided.

The distribution detection unit 26 processes the I signal from the first detection HPF 36 and the Q signal from the second detection HPF 38 as already described above. When the distribution detection unit 26 detects an unevenness in the distribution, the distribution detection unit 26 rewrites the value of the signal in the first detection HPF 36 with the value of the direct current component measured in the first measurement filter 18. Further, when the distribution detection unit 26 detects an unevenness in the distribution, the distribution detection unit 26 rewrites the value of the signal in the second detection HPF 38 with the value of the direct current component measured in the second measurement filter 20.

Figure 10:
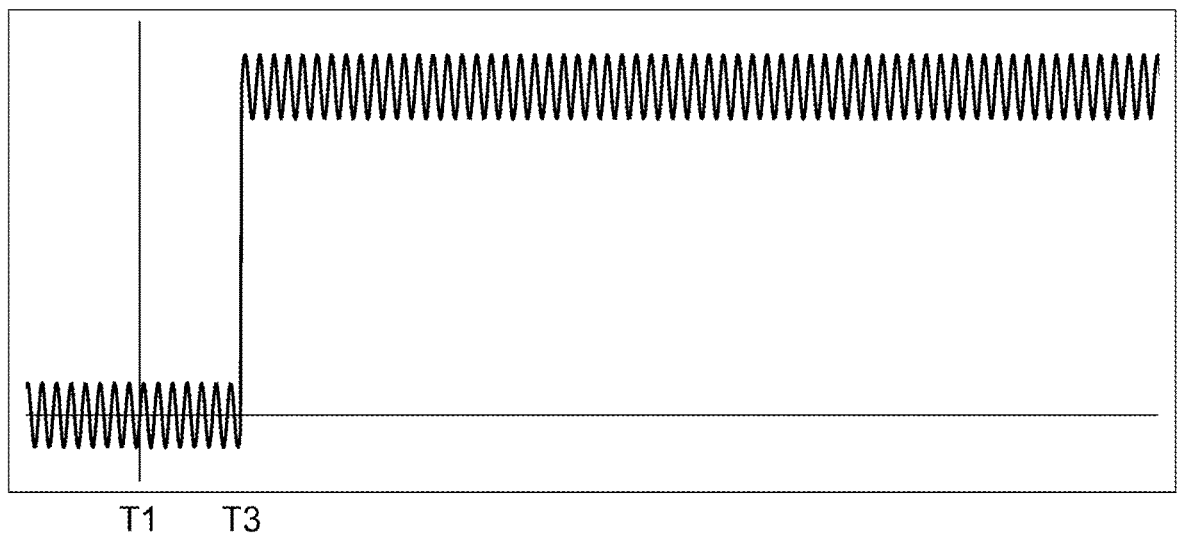
FIG. 10 shows a waveform of a signal input to the first HPF of FIG. 9.

FIG. 10 shows a waveform of a signal input to the first HPF 22. The I signal delayed by the first delay circuit 32 is input to the first HPF 22. The delay time induced by the first delay circuit 32 is denoted by "T3-T1".

Figure 11:
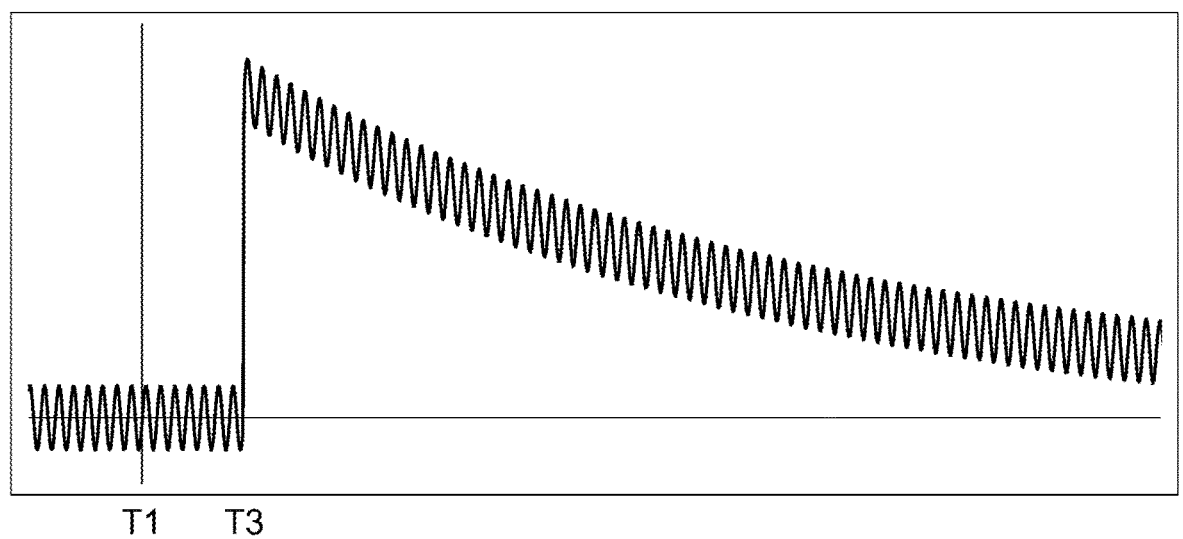
FIG. 11 shows a waveform of a signal output from the first HPF in the absence of determination in the distribution detection unit of FIG. 9.

FIG. 11 shows a waveform of a signal output from the first HPF 22 in the absence of determination in the distribution detection unit 26. When the first HPF 22 operates simply as an HPF, the variation in the direct current component since "T3" is directly output, and the direct current component converges to "0" in accordance with the time constant of the first HPF 22.

Figure 12:
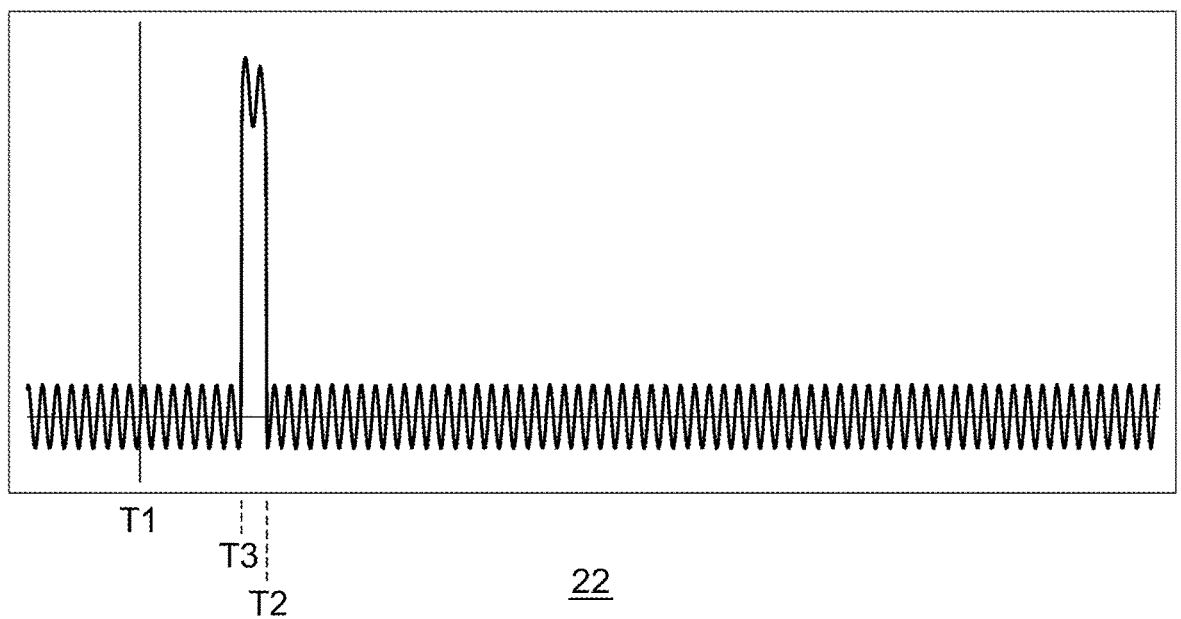
FIG. 12 shows a waveform of a signal output from the first HPF of FIG. 9.

FIG. 12 shows a waveform of a signal output from the first HPF 22. At "T2", the signal in the first HPF 22 is replaced by the value of the direct current component measured in the first measurement filter 18 so that the period of time subject to the impact from variation in the direct current component is further reduced.

According to this embodiment, the baseband signal is delayed over a period of time commensurate with the processing delay in the measurement filter before outputting the baseband signal to the high-pass filter so that the timing of input of the baseband signal to the high-pass filter is delayed. Since the timing of input of the baseband signal to the high-pass filter is delayed, the period of time subject to the impact from variation in the direct current component is further reduced.

Embodiment 3

A description will now be given of Embodiment 3. Like the foregoing embodiments, Embodiment 3 also relates to direct conversion reception devices. Embodiment 3 is also directed to the purpose of further reducing the period of time subject to the impact from variation in the direct current component. The following description concerns a difference from the foregoing embodiments.

Figure 13:
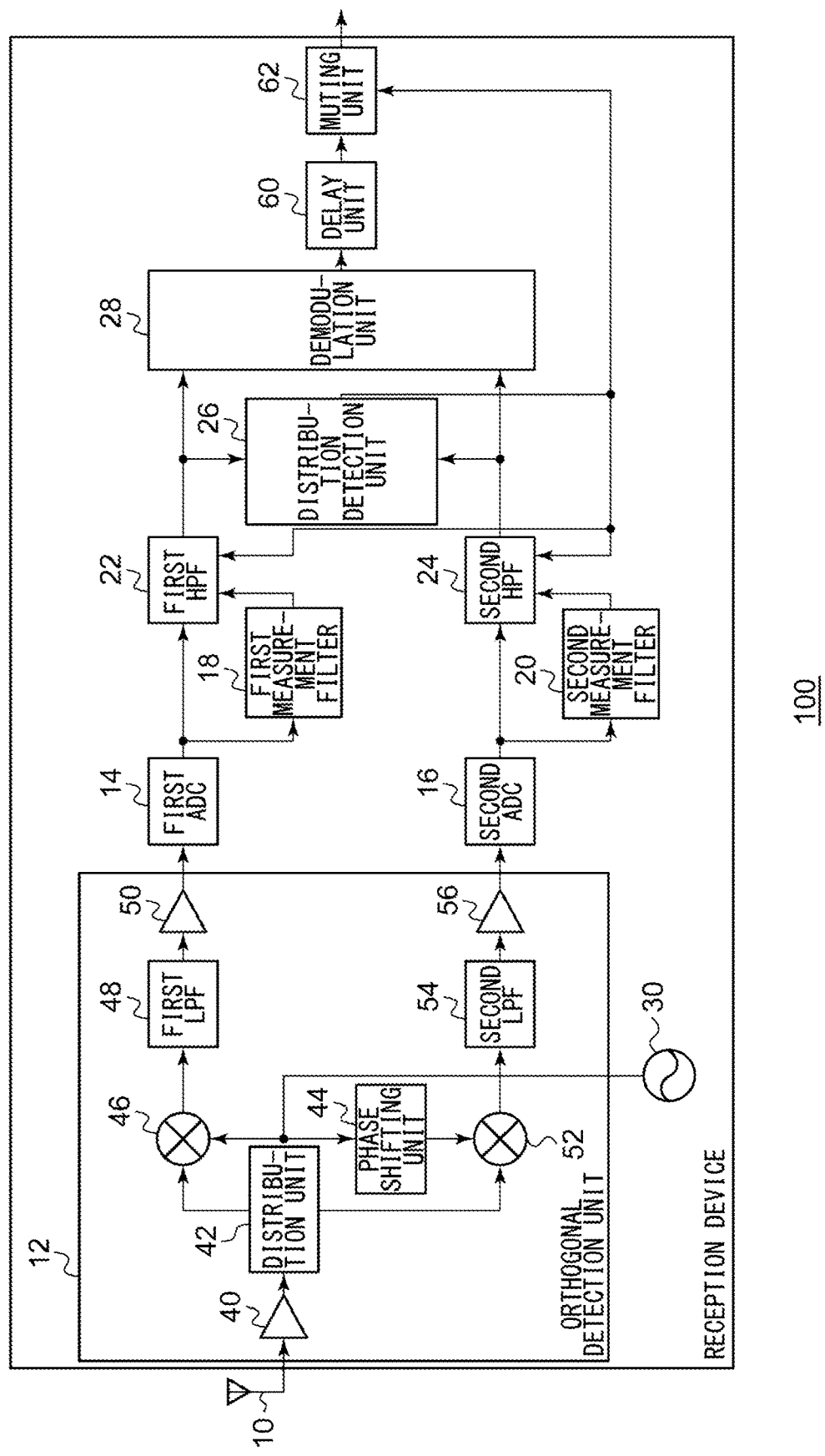
FIG. 13 shows a configuration of the reception device according to Embodiment 3.

FIG. 13 shows a configuration of the reception device 100 according to Embodiment 3. In addition to the features of FIG. 1, the reception device 100 includes a delay device 60 and a muting unit (muting circuit) 62. The delay device 60 is connected to the demodulation unit 28 and receives the demodulated signal from the demodulation unit 28. The delay device 60 delays the demodulated signal and outputs the delayed demodulated signal (hereinafter, also referred to as "demodulated signal") to the muting unit 62. The muting unit 62 receives the demodulated signal from the delay device 60. When the distribution detection unit 26 detects an unevenness in the distribution, the muting unit 62 mutes the demodulated signal. In other words, the muting unit 62 brings the demodulated signal to "0" over a certain period of time.

Figure 14:
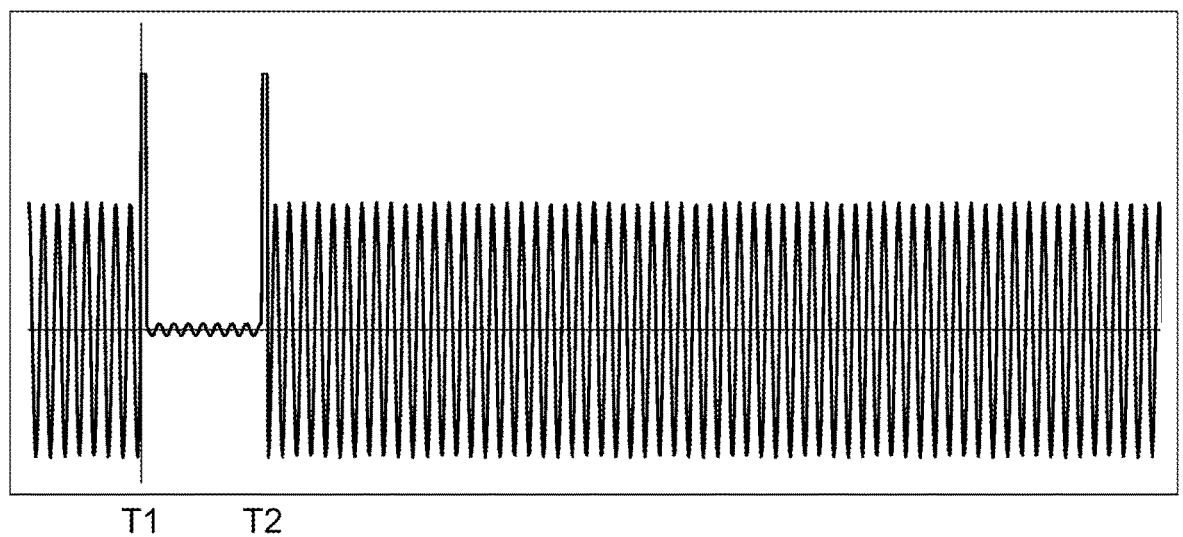
FIG. 14 shows a waveform of a signal output from the demodulation unit of FIG. 12.

FIG. 14 shows a waveform of a signal output from the demodulation unit 28. It is assumed that the waveform of the signal output from the first HPF 22 is identical to that of FIG. 8. When the frequency modulated signal is demodulated, for example, a large amplitude variation in the I signal and the Q signal may result in a large phase change. Therefore, a pulse waveform may occur at "T1" and "T2".

Figure 15:
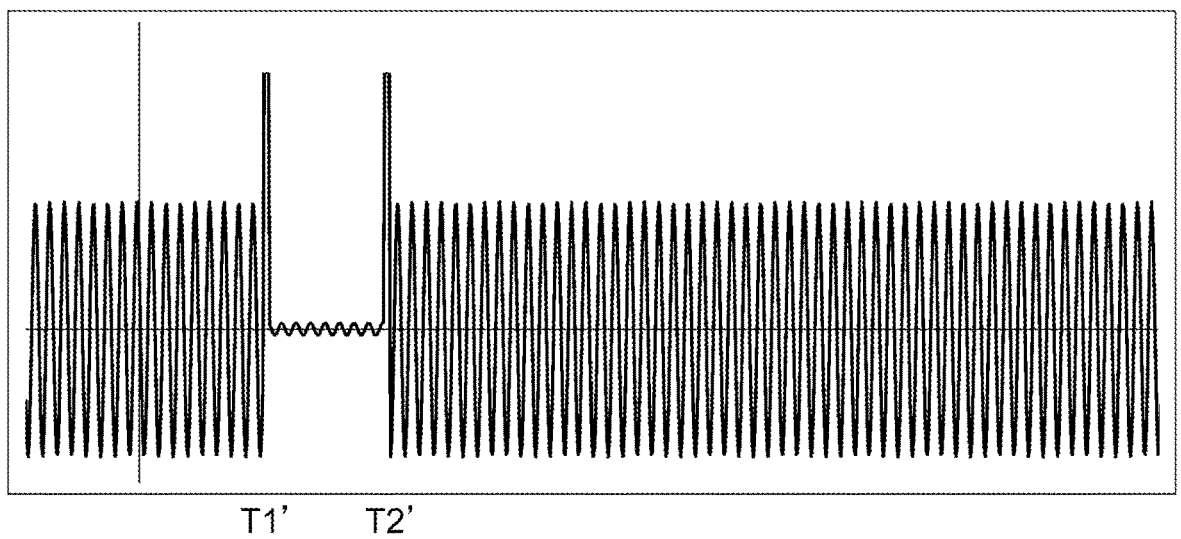
FIG. 15 shows a waveform of a signal output from the delay device of FIG. 12.

FIG. 15 shows a waveform of a signal output from the delay device 60. The delay induced by the delay device 60 shifts the pulse waveform occurring at "T1" to "T1'" and shifts the pulse waveform occurring at "T2" to "T2'".

Figure 16:
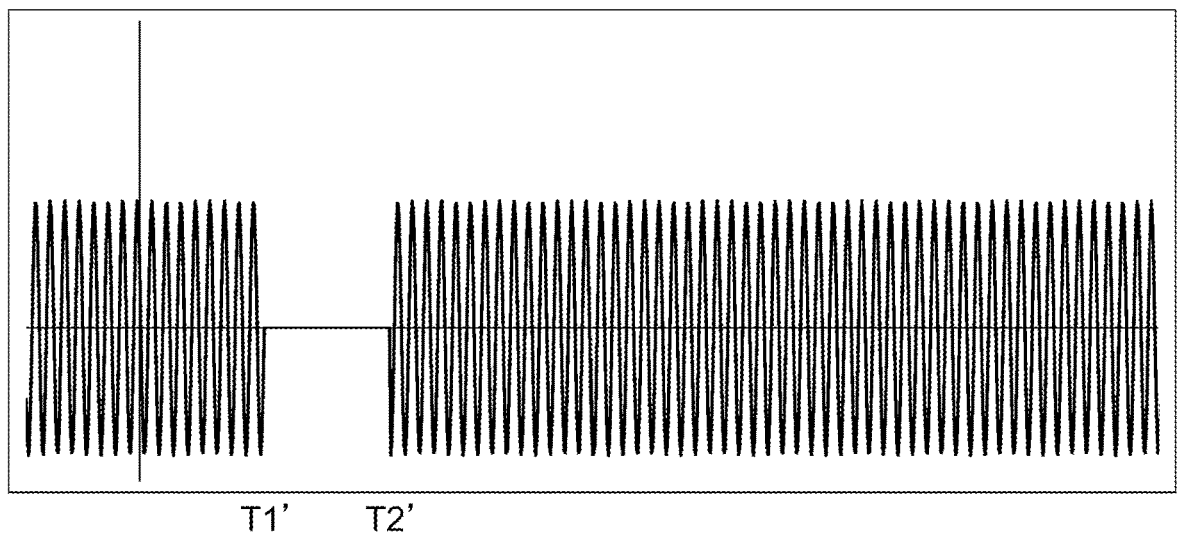
FIG. 16 shows a waveform of a signal output from the muting unit of FIG. 12.

FIG. 16 shows a waveform of a signal output from the muting unit 62. The muting unit 62 brings the pulse waveform occurring at "T1'" and "T2'" to "0".

According to this embodiment, a distorted demodulated signal is output until the distribution detection unit detects an unevenness in the distribution. However, the distorted demodulated signal is delayed and muted so that the distorted demodulated signal is prevented from being output. Further, since the distorted demodulated signal is prevented from being output, the period of time subject to the impact from variation in the direct current component is further reduced.

Described above is an explanation based on an exemplary embodiment. The embodiment is intended to be illustrative only and it will be understood by those skilled in the art that various modifications to constituting elements and processes could be developed and that such modifications are also within the scope of the present invention.

Arbitrary combinations of Embodiments 1 through 3 are equally effective. According to this variation, the advantage from the combination is enjoyed.

What is claimed is:

1. A reception device comprising:
    an orthogonal detector that subjects a received signal to orthogonal detection so as to output an I-phase baseband signal and a Q-phase baseband signal orthogonal to each other;
    high-pass filters that reduce a direct current component of the respective baseband signals output from the orthogonal detector;
    a demodulator that demodulates the baseband signals output from the high-pass filters; and
    a distribution detector that detects an unevenness in a distribution of each of the baseband signals with the reduced direct current component, wherein
    when the distribution detector detects an unevenness in the distribution, the distribution detector changes a status of the high-pass filters.

2. The reception device according to claim 1, further comprising:
    measurement filters that measure the direct current component of the respective baseband signals output from the orthogonal detector, wherein
    when the distribution detector detects an unevenness in the distribution, the distribution detector rewrites a value of a signal in the high-pass filters into a value of the direct current component measured by the measurement filters.

3. The reception device according to claim 2, further comprising:
    delay circuits that delay the respective baseband signals output from the orthogonal detector over a period of time commensurate with a processing delay in the respective measurement filters so as to output the respective baseband signals thus delayed to the respective high-pass filters; and detection high-pass filters that reduce the direct current component of respective baseband signals output from the orthogonal detector and output the respective baseband signals with the reduced direct current component to the distribution detector, wherein when the distribution detector detects an unevenness in the distribution, the distribution detector rewrites a value of a signal in the detection high-pass filters into a value of the direct current component measured by the measurement filters.

4. The reception device according to claim 1, further comprising:

a muting circuit that mutes a signal output from the demodulator when the distribution detector detects an unevenness in the distribution.

5. A reception method comprising:

subjecting a received signal to orthogonal detection so as to output an I-phase baseband signal and a Q-phase baseband signal orthogonal to each other;

reducing a direct current component of each of the baseband signals by using high-pass filters;

demodulating each of the baseband signals with the reduced direct current component;

detecting an unevenness in a distribution of each of the baseband signals with the reduced direct current component; and changing a status of the high-pass filters when an unevenness in the distribution is detected.

6. A non-transitory computer readable recording medium encoded with a computer program, the program comprising computer-implemented modules including:

a module that subjects a received signal to orthogonal detection so as to output an I-phase baseband signal and a Q-phase baseband signal orthogonal to each other;

a module that reduces a direct current component of each of the baseband signals by using high-pass filters;

a module that demodulates each of the baseband signals with the reduced direct current component;

a module that detects an unevenness in a distribution of each of the baseband signals with the reduced direct current component; and a module that changes a status of the high-pass filters when an unevenness in the distribution is detected.

* * * * *